(12) United States Patent
Miller

(10) Patent No.: US 6,606,575 B2
(45) Date of Patent: Aug. 12, 2003

(54) CROSS-CORRELATION TIMING CALIBRATION FOR WAFER-LEVEL IC TESTER INTERCONNECT SYSTEMS

(75) Inventor: Charles A. Miller, Fremont, CA (US)

(73) Assignee: FormFactor, Inc., Livermore, CA (US)

( * ) Notice: Subject to any disclaimer, the term of this patent is extended or adjusted under 35 U.S.C. 154(b) by 76 days.

(21) Appl. No.: 09/752,839

(22) Filed: Dec. 29, 2000

(65) Prior Publication Data

US 2002/0049554 A1 Apr. 25, 2002

Related U.S. Application Data

(63) Continuation-in-part of application No. 09/598,399, filed on Jun. 20, 2000.

(51) Int. Cl.[7] ............................................. G06F 19/00
(52) U.S. Cl. ............................... 702/104; 324/158
(58) Field of Search ................................. 324/754, 751; 714/814; 380/218; 327/538; 360/53

(56) References Cited

U.S. PATENT DOCUMENTS

| | | | |
|---|---|---|---|
| 5,086,271 A | 2/1992 | Haill et al. | |
| 5,162,728 A | 11/1992 | Huppenthal | |
| 5,262,716 A * | 11/1993 | Gregory, Jr. et al. | 324/754 |
| 5,270,643 A * | 12/1993 | Richardson et al. | 324/751 |
| 5,608,337 A | 3/1997 | Hendricks et al. | |
| 5,736,850 A | 4/1998 | Legal | |
| 5,754,353 A * | 5/1998 | Behrens et al. | 360/53 |
| 5,828,226 A | 10/1998 | Higgins et al. | |
| 5,844,988 A * | 12/1998 | Ryan et al. | 380/218 |
| 6,022,750 A | 2/2000 | Akram et al. | |
| 6,040,691 A | 3/2000 | Hanners et al. | |
| 6,064,948 A * | 5/2000 | West et al. | 702/119 |
| 6,137,346 A * | 10/2000 | Miller | 327/538 |
| 6,163,759 A | 12/2000 | Kita | |
| 6,181,144 B1 | 1/2001 | Hembree et al. | |
| 6,192,496 B1 | 2/2001 | Lawrence et al. | |
| 6,298,465 B1 * | 10/2001 | Klotchkov | 714/814 |
| 6,300,757 B1 | 10/2001 | Janssen | |
| 6,327,678 B1 | 12/2001 | Nagai | |

FOREIGN PATENT DOCUMENTS

| | | |
|---|---|---|
| DE | 199 15 398 A1 | 10/1999 |
| DE | 198 17 763 A1 | 11/1999 |
| DE | 199 22 907 A1 | 12/1999 |
| EP | 0 566 823 A2 | 10/1993 |
| EP | 0 919 823 A2 | 6/1999 |

\* cited by examiner

Primary Examiner—John Barlow
Assistant Examiner—Xiuqin Sun
(74) Attorney, Agent, or Firm—Smith-Hill & Bedell, PC

(57) ABSTRACT

To calibrate timing of test signals generated by all channels of an integrated circuit, each channel is programmed to generate a test signal having a repetitive pseudo-random test signal edge pattern. The test signal pattern of each channel is compared to a reference signal having the same edge pattern and the delay of each channel is adjusted to maximize cross-correlation between the test signal and the reference signal.

22 Claims, 6 Drawing Sheets

Figure 1:
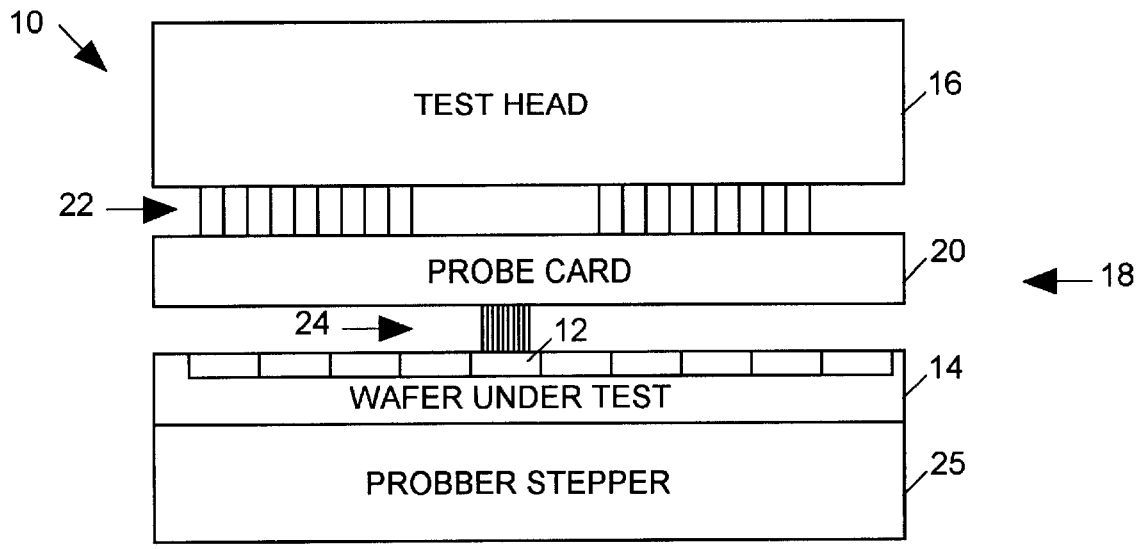

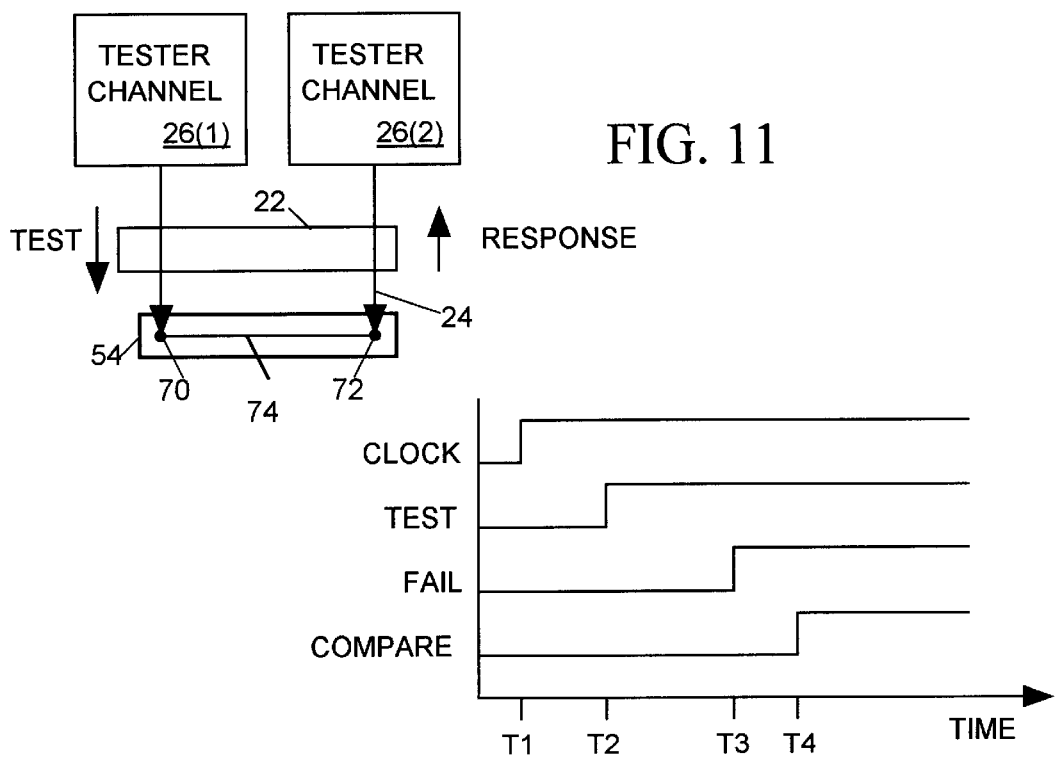
FIG. 11
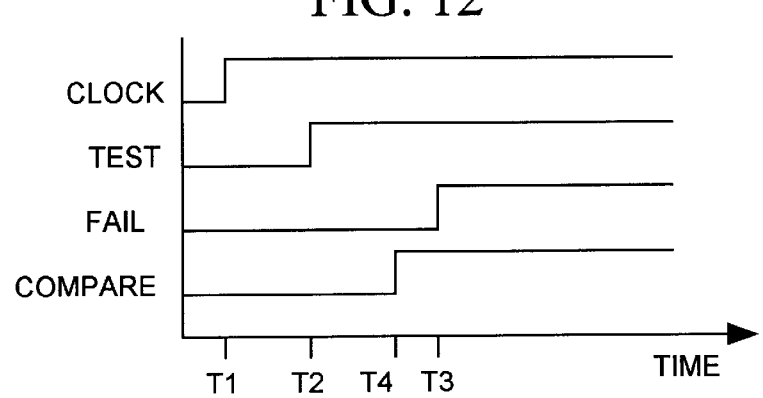
FIG. 12
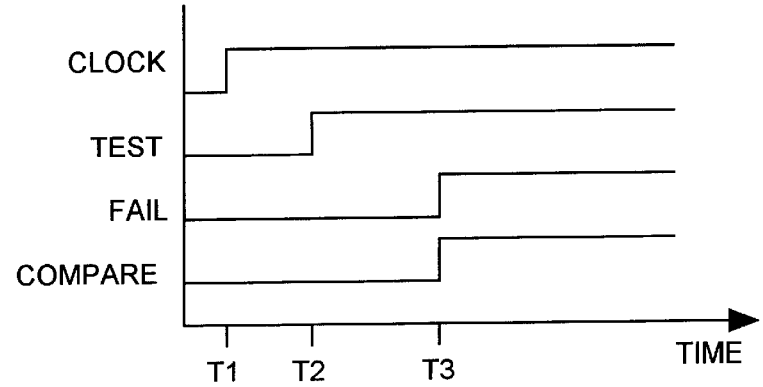
FIG. 13
FIG. 14

CROSS-CORRELATION TIMING CALIBRATION FOR WAFER-LEVEL IC TESTER INTERCONNECT SYSTEMS

CROSS-REFERENCE TO RELATED APPLICATIONS

The present application is a continuation-in-part of application Ser. No. 09/598,399 filed Jun. 20, 2000.

BACKGROUND OF THE INVENTION

1. Field of the Invention

The present invention relates in general to integrated circuit (IC) wafer testers and in particular to a system for calibrating signal timing of IC wafer tester channels to compensate for variation in signal paths between the tester and test probe points on a calibration substrate.

2. Description of Related Art

Integrated circuits (ICs) are fabricated in the form of die on a semiconductor wafer but are thereafter separated and packaged. To avoid the cost of packaging defective ICs an IC tester can test ICs while they are still in wafer form. An IC tester tests an IC by sending a sequence of test signals to its input terminals and monitoring the output signals produced by the IC to determine whether they behave as expected. A typical integrated circuit tester includes a "test head" containing circuit boards implementing a set of tester channels, each capable of sending a test signal to the IC or of sampling an IC output signal to determine its state. An interconnect system links each tester channel to a separate I/O terminal (usually a bond pad) of a die on the wafer under test. A typical interconnect system includes a "probe card" having an upper surface including contact points for receiving tips of pogo pins extending downward from the test head for conveying signals between the channels in the test head and the probe card. A set of probes on an under surface of the probe card are arranged to contact the IC's bond pads. The probe card also includes vias and other conductors for interconnecting the probes and the pogo pin contacts. Since the product of the number of I/O terminals on a die and the number of die on a wafer usually exceeds the number of available channels on a tester, the tester usually tests part of the wafer per probe touchdown, sometimes only one die. A "prober-stepper" that holds the wafer while being tested, appropriately positions the die to be tested under the probes and brings the wafer into contact with the probe tips during testing. After each test is completed the prober-stepper repositions (steps) the wafer so that the probes access a next set of die to be tested.

To properly test an IC, a tester must coordinate the timing of the channels' test activities. When a first tester channel changes the state of a test signal at some IC input terminal, we might expect a second tester channel to observe a particular state change in an IC output signal appearing at another IC output terminal a specific time thereafter. We consider an IC to be defective when an appropriate IC output signal state change does not occur with the correct delay following an IC input signal state change. Thus the tester must closely coordinate the time at which the first tester channel changes the input signal state with the time at which the second tester channel samples the IC output signal to determine its state.

An IC tester synchronizes all test events to a periodic master clock signal supplied to all of its channels. The channels time their activities relative to the timing of edges of that master clock signal. However merely supplying the same master clock signal to all channels is not sufficient to ensure that they will precisely coordinate their event timing. One reason for this is that since the channels reside in separate locations within the test head, differences in the lengths or electrical characteristics of the separate paths the clock signal path must travel to reach the channels causes the clock signal edges to arrive at the channels at different times.

Differences in timing can also arise from differences between channels. While all tester channels are of identical design, process variations in ICs and other components forming the channels cause some channels to process signals slightly faster than others. Also since the channels reside in separate locations within the test head, they may operate in differing temperature environments or may be subject to differing levels of stray capacitance or other environmental factors that influence the speed with which signals pass through internal circuits and conductors within each channel.

Variations in the lengths or impedance characteristics of signal paths through the interconnect system linking the tester channels to the wafer also cause timing variations between the channels.

To provide more precise timing coordination, it is necessary to calibrate the timing of each channel to reduce the timing variations caused by such factors. A typical tester channel includes a timing signal generator producing a set of timing signals of varying phase relative to the master clock signal. The timing signals control the timing of various test events such as the state changes in the test signal sent to the IC or the sampling of DUT output signals. Tester channels also include mechanisms for delaying test activities by an adjustable amount to compensate for timing differences between channels.

To make use of such timing calibration systems test engineers separately monitor the timing of signals produced at each channel's test activities relative to a common timing reference and iteratively adjust each channel's timing delay as necessary to synchronize the channels. For example test engineers commonly program all channels to produce a test signal pulse in response to each edge of corresponding timing signals, use an oscilloscope or other device to measure timing differences between edges of timing signals produced at the each channels' I/O terminals, and adjust the timing calibration of all channels so that corresponding timing signal edges produced by all channels are concurrent. The monitoring of test signal edge timing at the channel I/O terminals rather than at the tips of the probes that contact the device under test does not account for differences in the signal paths provided by the interconnect system linking the channel I/O terminals to wafer bond pads. However test signal edges are monitored at the channel I/O ports, rather than at the probe tips because timing skew caused by interconnect system signal path differences can often be ignored. It is also much easier for an oscilloscope or other monitoring equipment to access the channel I/O terminals than to access the probe tips because the channel I/O terminals are much larger and more widely spaced than the probe tips.

However as the operating frequency of ICs has continued to increase, the resolution with which a tester must time test events has also increased to the point where even small variations in signal paths through the interconnect system can no longer be ignored. Therefore what is needed is a system for easily measuring timing differences between channels at the tips of the probes that contact the wafer under test.

SUMMARY OF THE INVENTION

The invention relates to a timing calibration system for a wafer level integrated circuit (IC) tester. The tester includes a set of probes for contacting pads on a surface of an IC and having a plurality of tester channels. Each channel generates a TEST signal at a tip of a corresponding probe in response to a periodic CLOCK signal with a delay adjusted by drive calibration data supplied as input to the tester channel. The TEST signal produced by each channel includes edges occurring in a timing pattern controlled by programming data provided as input to each tester channel.

In accordance with one aspect of the invention, to calibrate test signal timing of all channels, each channel is programmed to generate a test signal having the same repetitive edge timing pattern at the tester channel's corresponding probe tip.

In accordance with another aspect of the invention, the test signal produced at each probe tip is then cross-correlated to a periodic reference signal having the same repetitive edge timing pattern.

In accordance with a further aspect of the invention, drive calibration data of each channel is then iteratively adjusted to determine a value which maximizes the cross-correlation between its output test signal and the reference signal. This ensures that all tester channels delay similar test signals by similar intervals.

In accordance with yet another aspect of the invention, each repetition of the test and reference signal edge pattern provides pseudo-randomly distributed time intervals between successive signal edges. This helps to maximize the accuracy of the timing calibration by ensuring that the test signals have a wide range of frequency components so the timing calibration process takes into account frequency-dependent delay characteristics of the signal paths conveying the test signals to the IC.

It is accordingly an object of the invention to provide a system for adjusting the test signal calibration delays of IC tester channels so that their test signal timing may be closely coordinated.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

Figure 2:
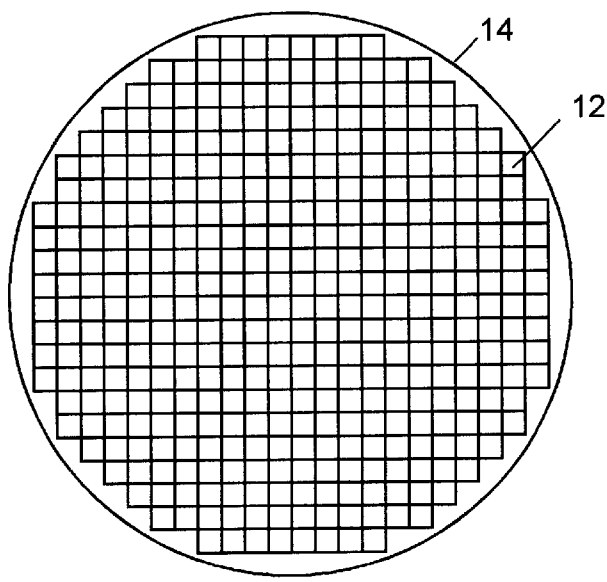
Figure 3:
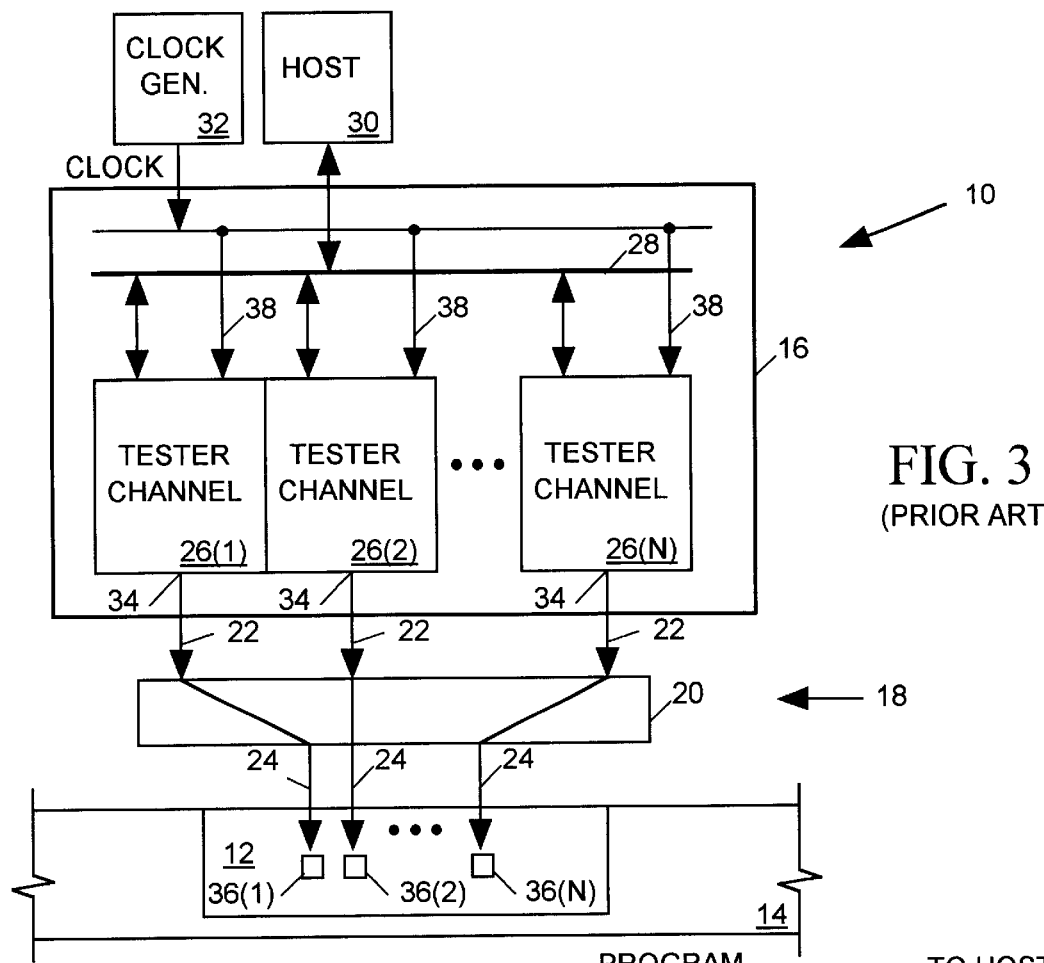
Figure 4:
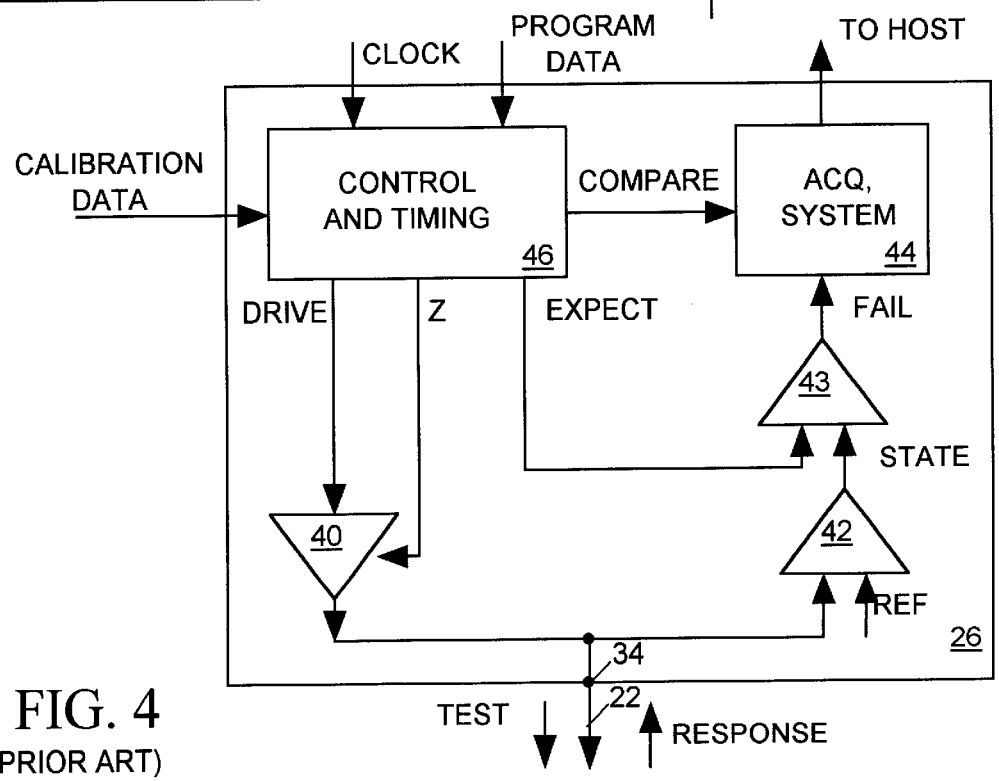
Figure 5:
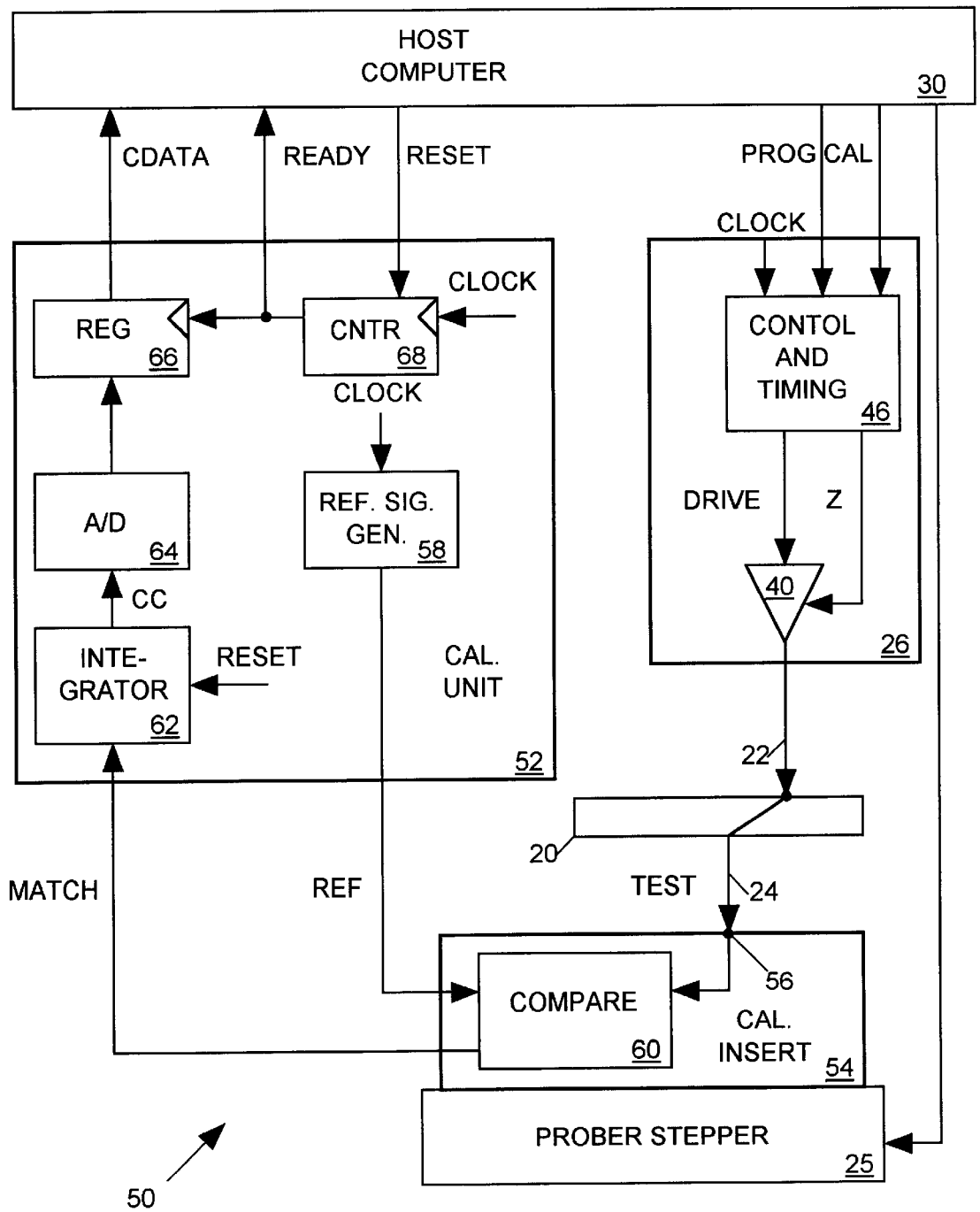
Figure 7:
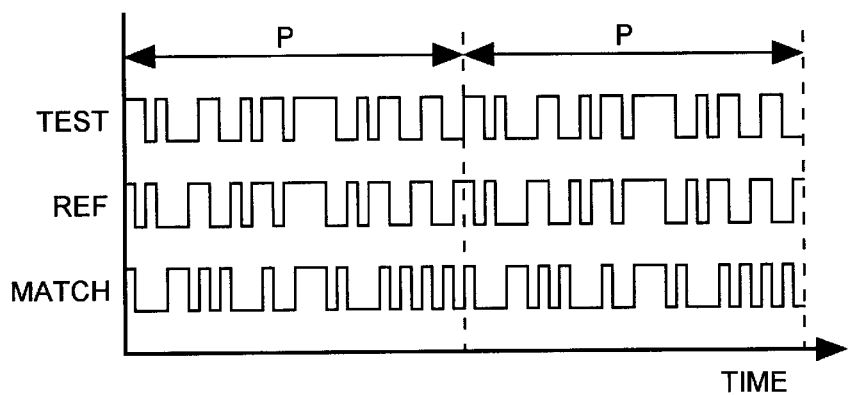
Figure 8:
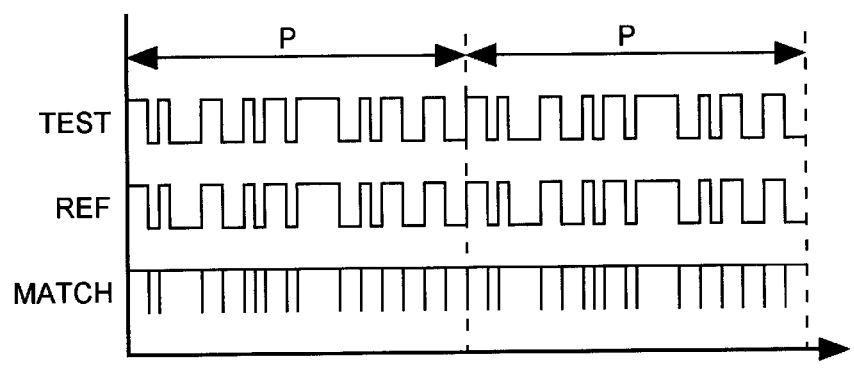
Figure 9:
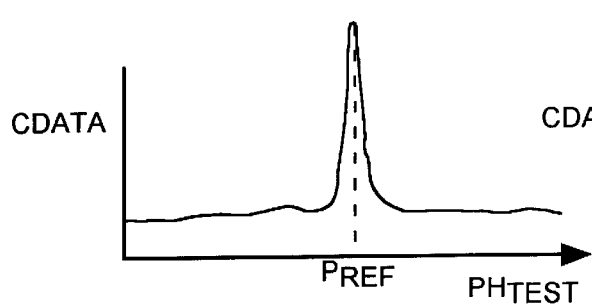
Figure 10:
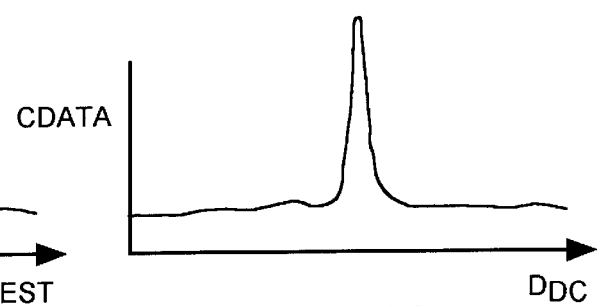
Figure 15:
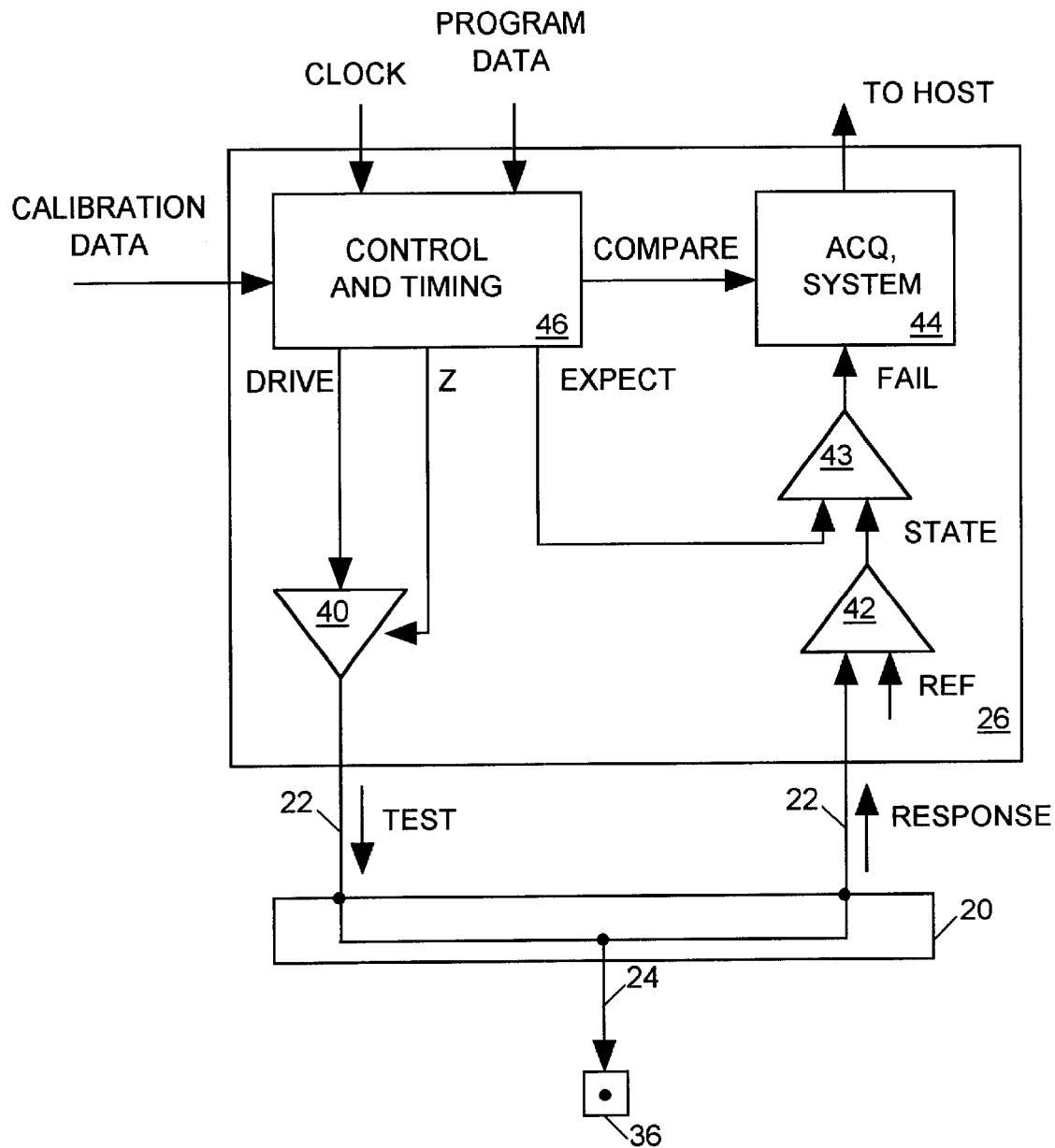

FIG. 1 is a simplified sectional elevation view of a typical prior art integrated circuit (IC) tester for testing ICs in the form of die on a semiconductor wafer, FIG. 2 is a simplified plan view of a prior art semiconductor wafer, FIG. 3 is a block diagram illustrating the prior art tester of FIG. 1, FIG. 4 illustrates one of the tester channels of the prior art tester of FIG. 3 in simplified block diagram form, FIG. 5 is a block diagram of an apparatus in accordance with the invention for calibrating the timing of the prior art tester of FIG. 1, FIGS. 6–8 are timing diagrams illustrating timing relationships between various signals of FIG. 5, FIG. 9 is a plot of a data value produced by the apparatus relative to an amount of phase correlation between test and reference signals of FIG. 5, FIG. 10 is a plot of a data value produced by the apparatus relative to an value of delay calibration data provided to a tester channel of FIG. 5, FIG. 11 is a block diagram illustrating a portion of an apparatus for calibrating compare timing of a channel of the tester of FIG. 5, FIGS. 12–14 are timing diagrams illustrating timing relationships between various signals of FIG. 5 during an iterative calibration process, and FIG. 15 illustrates in block diagram form an alternative version of a channel of the prior art tester of FIG. 3.

DESCRIPTION OF THE PREFERRED EMBODIMENT(S)

The present invention relates to a method and apparatus for accurately calibrating the event timing system of an integrated circuit (IC) tester. We will first describe the event timing system employed by a typical prior art IC tester and then describe how the present invention calibrates that timing system.

FIG. 1 is a simplified sectional elevation view of a typical prior art IC tester 10 designed to test an IC 12 while still in the form of a die on a semiconductor wafer 14. FIG. 2 is a plan view of a wafer 14 implementing a large number of ICs 12. Tester 10 includes "test head" 16, a chassis containing circuit boards implementing a set of tester channels. Each tester channel is capable of supplying a test signal input to a bond pad or other test point of IC 12 and/or of monitoring an IC output signal produced at that bond pad to determine its state. Tester 10 also includes an interconnect system 18 linking each tester channel within test head 16 to an appropriate bond pad on the surface of an IC 12 being tested. In this example, interconnect system 18 includes a probe card 20 having an upper surface including contact points for receiving tips of pogo pins 22 (or other interconnect structures such as coaxial cables) extending downward from test head 16 for conveying signals between the channels within the test head and probe card 20. A set of probes 24 (such as, for example, microspring contacts) on the lower side of probe card 20 are arranged to access the bond pads on the surface of IC 12 acting as the IC's I/O, power and ground terminals. Conductors (not shown) within probe card 20 link each pogo pin 22 to one or more probes 24 to complete the signal paths between the tester channels and bond pads of IC 12. In some cases various passive components such as resistors and capacitors may be mounted on probe card 20 to influence the frequency response of those signal paths.

Since wafer 14 implements a large number of ICs 12, and since each IC can have many bond pads, tester 10 does not have enough channels to test all ICs 12 on wafer 14 at the same time. Since tester 10 may test only one IC 12 or just a few ICs 12 concurrently, a "prober-stepper" 25 holding wafer 14 positions the particular IC (or ICs) 12 to be tested under probes 24 and brings them into contact with the probes. After each test is completed prober-stepper 25 repositions ("steps") wafer 14 so that the probes access the next IC (or ICs) to be tested.

FIG. 3 is a block diagram illustrating tester 10 of FIG. 1. Test head 16 includes a set of tester channels 26 interconnected via a bus 28 to a host computer 30. Before a test, host computer 30 programs each channel 26 to carry out a sequence of test activities in response to edges of a periodic CLOCK signal produced by a clock generator 32 and distributed to all tester channels 26. Interconnect system 18, including pogo pins 22, probe card 20 and probes 24, links channel I/O terminals 34 of tester channel 26 to the bond pads 36 on IC 12.

FIG. 4 illustrates one of tester channels 26 of FIG. 3 in simplified block diagram form. Tester channel 26 includes a tristate buffer 40 for transmitting a test signal to an IC terminal 36. An analog comparator circuit 42 compares an IC output signal produced at IC terminal 36 to a reference voltage (REF) and produces a digital output signal STATE indicating the state of the IC output signal. A digital comparator 43 compares the actual state of the IC output signal (STATE) to data representing its expected state (EXPECT) to produce a FAIL signal indicating whether the IC output signal is of its expected state. A data acquisition system 44 delivers the FAIL data for each test cycle to host computer 30.

A test is organized into a succession of test cycles, and before the start of a test, host computer supplies a program to the control and timing circuit 46 within each channel 26 referencing the test event(s) to occur during each test cycle and indicating a time relative to the start of the test cycle that each event is to occur. During the test, each successive edge of the CLOCK signal marks the start of a test cycle. Test events include a change in state of a TEST signal output of driver 40 or an occurrence of an IC output signal (RESPONSE) state that is to be compared to the expect data. Thus in response to the program data from host computer 30, control and timing circuit 46 may respond to an edge of the CLOCK signal marking the start of a test cycle by enabling or tristating buffer 40 via a signal Z, by driving the buffer's input signal (DRIVE) high or low, and/or by supplying EXPECT data to comparator 43 and signaling acquisition system 44 via a COMPARE signal to sample the FAIL data. When control and timing circuit 46 is to change the state of the TEST signal during a test cycle, the program data for that test cycle indicates a nominal delay (a "programmable drive delay") following the start of the test cycle that the channel is to wait before changing the TEST signal state. Similarly, when control and timing circuit 46 is to signal acquisition system 44 to sample the FAIL signal during a test cycle, the program data for that test cycle indicates a nominal delay (a "programmable compare delay") following the start of the test cycle that the channel is to wait before signaling the acquistion system to sample the FAIL signal.

Before the start of a test, host computer 30 also supplies calibration data to each channel 26 via bus 28 (FIG. 3) to calibrate the timing of the DRIVE, Z and COMPARE signals produced by control and timing circuit 46. Suppose, for example, channel 24(1) is to change the state of a test signal sent to bond pad 36(1) during a test. Suppose also that tester channel 26(2) is expected to observe a particular state change in an IC output signal appearing at bond pad 36(2) T nanoseconds later. We would consider IC 12 to be defective if the output signal state change does not occur at bond pad 36(2) with the correct delay following the input signal state change. Thus tester 10 must be able to closely coordinate the time at which any tester channel 26 changes the state of a test signal, and the time at which any other tester channel 26 subsequently samples an IC output signal.

Since all channels 26 time their activities in relation to edges of the same CLOCK signal, those activities can be closely synchronized. However differences in the lengths or electrical characteristics of the paths 38 (FIG. 1) conveying the CLOCK signal to each channel 26 can cause CLOCK signal edges to arrive at the channels at slightly different times, thereby adversely affecting coordination of test events. Timing differences can also arise from channel-to-channel variations in inherent delays of the various channel components 40–46 (FIG. 4) or from variations in the lengths or impedance characteristics of signal paths through the interconnect system 18 linking the tester channels 26 to IC pads 36.

Host computer 30 therefore supplies calibration data to the control and timing circuit 46 of each tester channel 26 (FIG. 4) to adjust the timing of test events carried out by the channel relative to the CLOCK signal to account for such variations so that all channels can closely coordinate test signal state changes and output signal sampling.

Referring to FIG. 4, the total drive delay $D_{DT}$ between a CLOCK signal edge and appearance of a test signal edge at IC terminal 36 is equal to the sum of the following delays:

$D_{DI}$: An inherent drive delay of the control and timing circuit, $D_{DC}$: A drive calibration delay controlled by the calibration data, $D_{PD}$: A programmable drive delay set for each test cycle by program data from the host computer, $D_D$: An inherent delay of the tristate driver, and $D_{CP}$: An inherent path delay between the tester channel and the IC terminal.

Thus $D_{DT}=D_{DI}+D_{DC}+D_{PD}+D_D+D_{CP}$

Host computer 30 uses calibration data supplied to control and timing circuit 46 to adjust $D_{DC}$ for all tester channels so that, for example, when the programmable delay $D_{PD}$ is 0, the total delay $D_T$ is a constant K for all channels Hence, $K=D_{DI}+D_{DC}+D_D+D_{DP}$ Therefore during a test, when the program data input to control and timing circuit 46 tells it to send a test signal edge to IC terminal 36 with a programmable delay $D_{PD}$ of T following a CLOCK signal edge, the test signal edge will actually arrive at terminal 36 with a delay of T+K after the CLOCK signal edge. The additional constant delay of K is not a problem because all channels provide the same additional constant drive delay.

The actual delay between a CLOCK signal edge and a COMPARE signal edge is $D_{CT}=D_{CI}+D_{CC}+D_{PC}+D_C+D_{CP}$ where $D_{CI}$ is an inherent compare delay of the control and timing circuit, $D_{CC}$ is a drive calibration delay controlled by the calibration data input to control and timing circuit 46, $D_{PD}$ is a programmable compare delay set for each test cycle by program data from the host computer, $D_C$ is an inherent delay of the tristate driver, and $D_{CP}$ is the inherent compare path delay between the tester channel and IC terminal.

When the program data tells control and timing circuit 46 that the IC output signal is to be sampled with a delay T following a CLOCK signal edge, control and timing circuit 46 should actually assert the COMPARE signal, not with a delay of T following the CLOCK signal, but at the precise moment at which the FAIL data represents the state of an IC output signal as it appeared at IC terminal 36 T+K seconds after the CLOCK signal, the calibrated drive delay. This ensures that a drive delay of T and a compare delay of T have the same meaning with respect to events at IC terminals 36.

Host computer 30 must adjust the compare calibration delay $D_{CC}$ for each channel so that when programmable compare delay $D_{PCP}$ is some value T, timing circuit 46 asserts the COMPARE signal with delay $D_{CT}=T+K+D_{CP}$.

Prior Art Timing Calibration

Prior art timing calibration systems typically set all tester channels 26 for the same programmable drive delay following each CLOCK signal edge and then employ an oscilloscope or other interval measurement device such as a wave crest box to measure the timing skew between test signals from channels 26 appearing at the tips of the pogo pins 22 (FIG. 3). Such systems iteratively adjust the calibration data input to control and timing circuit 46 (FIG. 4) so that there are no measurable timing skew difference between test signal outputs of the various channels at the pogo pin tips when the channels are programmed for the same nominal delay. The Z signal delay is calibrated in a similar manner.

The COMPARE signal timing for each channel 26 is typically calibrated after the DRIVE signal timing is calibrated. One way to do that is to program a channel to send a TEST signal edge to an open or short circuited probe tip at some known time after each CLOCK signal pulse. The edge is then reflected back to compare circuit 42. The REF voltage and EXPECT data are set to cause the FAIL signal to change state in response to each reflected DRIVE signal edge. The calibration data input to control and timing circuit 46 of each channel 26 is then iteratively adjusted until acquisition system 44 samples the FAIL signal just as it changes state.

The calibration process is carried out at the tips of pogo pins 22 (FIG. 1) rather than at the tips of the probes 24 that contact IC bond pads 36 because pogo pins 22 are larger and more widely spaced than probes 24 and are therefore much easier for test equipment to access. Although variations in the signal paths through probe card 20 and probes 24 can increase timing differences between channels 26, such variations have been negligibly small in the past. However as IC input and output signal frequencies increase, small variations in signal path delay between the signal paths through interconnect system 18 become significant and must be accounted for when calibrating the timing of tester channels 26. It is therefore desirable when calibrating the timing of channels 26 to measure output signal skew at the tips of probes 24 rather than at the tips of the more easily accessible pogo pins 22. The present invention allows us to do that.

Drive Calibration

The present invention provides a method for accurately adjusting the drive and compare calibration delays of channels 26 of tester 10 (FIG. 3) at the tips of probes 24 so as to account for time delays through interconnect system 18. The drive calibration delays are adjusted first, and then the compare calibration delays are adjusted.

FIG. 5 illustrates in block diagram form an apparatus 50 for adjusting the drive calibration delay of each channel 24 in accordance with the invention. Drive calibration apparatus 50 includes a calibration unit 52 residing within or external to the tester's test head 16 (FIG. 1) and a calibration insert 54 residing on the prober/stepper 25 (FIG. 1) during the calibration process in place of the wafer 14 to be tested later. To determine how to adjust the drive calibration data for a particular tester channel 26, the host computer 30 signals prober stepper 25 to position calibration insert 54 so that a contact 56 on the upper surface of calibration insert 54 contacts the particular probe 24 on the underside of probe card 20 that normally delivers the channel's output TEST signal to a bond pad on the surface of the wafer being tested.

Figure 6:
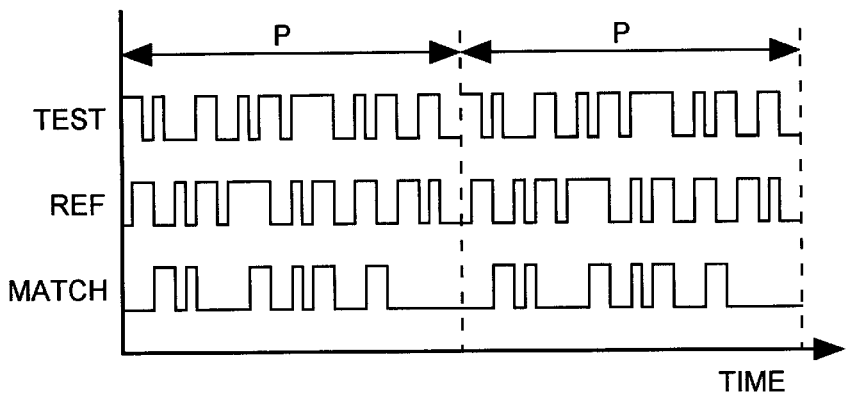

Host computer 30 also programs the channel's control and timing unit 46 so that it produces a repetitive TEST signal pattern in response to the system CLOCK signal. The TEST signal may have uniform periods between successive pulses, but it is preferable that with each repetition of the TEST signal pattern, time intervals between successive TEST signal pulse edges be non-uniform or pseudo-random. FIG. 6 illustrates a suitable pseudo-random TEST signal pattern that is repetitive with a period P ns (nanoseconds) but wherein pulses within each cycle are of non-uniform, pseudo-random width and separation.

HOST computer 30 also programs a reference signal generator 58 (suitably a spare tester channel) to produce a reference signal REF having a pattern similar to that of the TEST signal. As illustrated in FIG. 6, the calibration insert includes a compare circuit 60 for comparing the TEST and REF signals and producing an output MATCH signal. The MATCH output of compare circuit 60 indicates how well the amplitude of the TEST signal matches that of the REF signal. When both signals are high or both signals are low, the MATCH signal is high. When the TEST signal and the REF signals are of opposite states, the MATCH signal is low. Compare circuit 60 may be implemented by an XOR gate, but it is preferable to implement compare circuit 60 as an analog circuit, for example via an analog multiplier, so that the MATCH signal amplitude can fall anywhere within a continuous range of values depending on how well the TEST signal amplitude matches the REF signal amplitude.

While channel 26 and reference signal generator 52 are programmed to produce TEST and REF signals having similar pattern in response to the same CLOCK signal, the TEST and REF signals won't necessary arrive at compare circuit 60 in phase with one another. The phase deference between the two signals arises from differences in signal path lengths and in the inherent delays with which channel 26 and reference signal generator 58 respond to the CLOCK signal. The programmable drive calibration delay of control and timing circuit 46 also influences the phase difference between the TEST and REF signals calibration unit 52 processes the MATCH signal to provide cross-correlation data (CDATA) that is a measure of the phase difference between the TEST and REF signals. Host computer 30 calibrates the drive delay of tester channel 26 by iteratively adjusting the calibration data input to control and timing circuit 46 until the CDATA indicates that the TEST signal is in phase with the REF signal.

FIGS. 6–8 are simplified timing diagrams illustrating the nature of the MATCH signal for three different phase relationships between the TEST and REF signals. In practice the TEST, REF and MATCH signals can be noisy and jittery and will have less abrupt edges that depicted in FIGS. 6–8. FIGS. 6, 7 and 8 illustrate the MATCH signal produced when the TEST signal lags the REF signal by 3P/16, P/64 and nearly 0 ns. respectively. Note that as the TEST signal is brought closer into phase with the REF signal, the MATCH signal is more frequently high than low. When the TEST signal is substantially in phase with the REF signal as illustrated in FIG. 8, the MATCH signal will be high most of the time and will be low only briefly during signal transitions. Even when the TEST signal is as close as possible in phase to the REF signal, jitter and noise in the TEST and REF signals will cause them to transition at slightly different times or rates. Thus the MATCH signal will have some negative-going spikes during TEST and REF signal transitions.

Referring again to FIG. 5, calibration unit 52 includes a conventional integrator circuit 62 which integrates the MATCH signal to produce an input to an A/D converter 64. A/D converter 64 converts the analog output of integrator 62 into digital data input to a register 66 clocked by a counter 68. After programming control and timing circuit 46 and reference signal generator 58 to produce TEST and REF signal having the same pattern, host computer resets counter 68 and integrator 62. Integrator 62 then begins integrating the MATCH signal and its analog output "cross-correlation" signal CC begins to increase in value at an average rate that is proportional to the amount of time during each period P of the TEST signal that the MATCH signal is high. Thus the closer that the TEST signal is in phase to the REF signal, the more rapidly analog CC signal magnitude increases.

When counter 68 has counted a number of CLOCK signal cycles spanning a large number of TEST signal periods, it transmits a READY signal to register 66 telling it to load the digital output of A/D converter 64, a value proportional to the current magnitude of cross-correlation signal CC. Host computer 30 also responds to the READY signal by reading the value of the cross-correlation data (CDATA) last stored in register 66.

FIG. 9 graphically illustrates the relationship between the value of CDATA that host computer 30 reads and the phase of the TEST signal $PH_{TEST}$ relative to the phase $PH_{REF}$ of the REF signal. Note that CDATA increases rapidly to a maximum as $PH_{TEST}$ approaches $P_{REF}$.

FIG. 10 graphically illustrates the relationship between the value of CDATA and the value of $D_{DC}$ the programmable drive calibration data host computer 30 writes into the control and timing circuit 46 of tester channel 26. Host computer 30 iteratively adjusts the drive calibration data, resets the calibration unit 52, and acquires the CDATA output of calibration unit 52 several times in succession to determine a particular drive calibration delay $D_{DC}$ for which CDATA is reaches a maximum. Host computer 30 then sets the drive calibration delay to that level.

Host computer 30 then signals prober stepper 25 to position contact 56 of calibration insert 54 under the probe 24 conveying a TEST signal from a second one of the tester channels 26 and repeats the entire iterative calibration process to determine the particular drive calibration delay that brings the second tester channel's TEST signal input in phase with the REF signal. That ensures that during a test, when the first and second channel's programming data tells them to produce a TEST signal edge at the same time relative to some CLOCK signal edge, the two TEST signal edges will arrive at the tips of their respective probes 24 at the same time. By repeating the drive delay calibration process for all tester channels, host computer 30 can ensure that all channels 26 will be closely synchronized with one another with respect to the timing of their TEST signal edges.

The above-described calibration method can closely coordinate the channels' TEST signal edge timing even though noise and jitter in the TEST and REF signals during the calibration process causes random variations in the relative phases of individual TEST and REF signal edges. Since the CDATA output of calibration unit 52 represents an average phase relationship between the TEST and REF signals over many TEST signal cycles, minor various in phase due to noise and jitter tend to be self-canceling.

As mentioned above the TEST and REF signal pulses produced during the calibration process need not be of pseudo-random spacing and width—they could be simple periodic waveforms having uniform pulse spacing and widths. However the TEST signals that can be generated during a test can have a wide range frequencies, and the inherent delay of signal paths conveying the TEST signals to the IC under test can be frequency dependent. IT is therefore preferable to use pseudorandom spacing because the frequency spectrum of a pseudo-random pulse sequence is much flatter than that of a simple periodic waveform. Since a pseudo-random sequence is more of a wide-band signal than a simple periodic square wave, the drive calibration result is less frequency dependent.

Compare Calibration

After host computer 30 has adjusted the drive calibration data for all channels 26 so that can closely coordinate their TEST signal timing, the host computer's next step is to appropriately adjust the compare calibration data of all channels 26. Referring to FIG. 4, when the program data tells control and timing circuit 46 to change the state of the TEST signal with a particular delay following the start of a test cycle, the TEST signal state change is supposed to occur at bond pad 36 at that time. Hence control and timing circuit 46 must actually signal driver 40 to change the state of the TEST signal sometime earlier to allow time for the TEST signal wave front to reach pad 36 at the correct time during the test cycle. When host computer 30 has adjusted the drive calibration data for all channels 26 as described above, then all of the channels 26 will deliver TEST signal edges to their respective bond pads 36 at the same time when they are programmed to do so.

Host computer 30 must now appropriately adjust the compare calibration data for each channel 26 that the channel uses the same relative timing for FAIL signal sampling as it uses for TEST signal state changes. Test timing is referenced to TEST and RESPONSE signal events occurring at bond pad 36. Thus when the test program data indicates that a channel 26 is to determine whether the RESPONSE signal matches the EXPECT data T ns after the start of a test cycle, the channel's acquistion system 44 must actually sample the FAIL signal some time later to allow for the time the RESPONSE signal requires to travel from bond pad 36 to comparator 42, and to allow for the time comparators 42 and 43 and acquistion system 44 require to produce and sample the FAIL signal.

With all channel's test signal timing appropriately calibrated, host computer 30 adjusts the compare calibration data of each channel. As illustrated in FIG. 11, calibration insert 54 includes an additional pair of pads 70 and 72 linked by a conductor 74 that can link two channels, such as channels 26(1) and 26(2), when calibration insert 54 is positioned so that their probes 24 contact pads 72 and 74. Thus the TEST signal output of channel 26(1) becomes the RESPONSE signal input to channel 26(2). When host computer 30 programs tester channel 26(1) to produce an edge in the TEST signal T ns after the start of a test cycle, and programs channel 26(2) to sample its incoming RESPONSE signal T ns after the start of the same test cycle, then if the compare calibration delay of tester channel 26(2) is properly adjusted, the sample FAIL signal represents the state of a point on the RESPONSE signal that is as close as possible to the RESPONSE signal edge as allowed by the channel's timing resolution capability.

FIGS. 12–14 illustrate timing relationships between the CLOCK, TEST, FAIL and COMPARE signals during the compare calibration process. When host computer 30 programs channel 26(1) so that it responds to each CLOCK signal edge arriving at a time T1 by sending a TEST signal edge to pad 70 at a time T2 where T2−T1=T ns, the FAIL signal changes state at a some time T3 (FIG. 12) following the CLOCK signal edge. The delays T2−T1 and T3−T1 are fixed and do not change during the compare calibration process. When host computer 30 also programs channel 26(2) so that it has a programmable COMPARE signal delay $D_{CD}$ of N, the total delay T4−T1 for the COMPARE signal will be the sum of $D_{CD}$, and the inherent and calibration delays of control and timing circuit 46. Whenever the sampled FAIL data produced by receiving channel 26(2) indicates that the COMPARE signal edge follows the FAIL edge, as illustrated in FIG. 12, host computer 30 decrements the compare calibration delay $D_{CC}$ of channel 26(2) to advance the COMPARE signal edge. Conversely, whenever the sampled FAIL data produced by receiving channel 26(2) indicates that the COMPARE signal edge precedes the FAIL edge, as illustrated in FIG. 13, host computer 30 increments the compare calibration delay $D_{CC}$ of the receiving channel 26(2) to retard the COMPARE signal edge. The compare calibration process for the receiving channel 26 ends when the COMPARE signal edge as nearly as possible coincides with the FAIL signal edge at time T3 as illustrated in FIG. 14.

Calibration insert 54 suitably includes other interconnected contacts similar to contact 70 and 72 arranged to allow each of the other tester channels 26(1) and 26(3)–26(N) to receive the TEST signal output of another channel so that host computer 30 can use a similar procedure to appropriately adjust their compare calibration data.

Fly-by Compare Calibration

Referring to FIG. 3, the driver 40 and comparator 42 of prior art tester channel 26 are linked to IC pad 36 via a single interconnect path. Thus when bond pad 36 is a bi-directional IC port that can both receive TEST signals and send RESPONSE signals, the two signals must travel over the same path between bond pad 36 and channel 26. In high frequency applications, the interconnect system path delay adversely affects the channel's ability to determine the state of an IC output signal pulse that closely follows or precede an IC input signal pulses since parts of the two pulses can overlap at the input of comparator 42.

FIG. 15 illustrates an alternate "fly-by" system for connecting channel 26 to pad 36 via two paths, one from driver 40 to pad 36 and the other from pad 36 to comparator 42. The fly-by interconnect reduces the TEST and RESPONSE signal overlap.

The tester channel 26 of FIGS. 3 and 15 can be drive and compare calibrated in the manner described above regardless of whether one or two paths are used to connect the channel to pad 36. However with the fly-by connection shown in FIG. 15, the compare calibration also can be carried out in a slightly different manner that does not require two channels to be interconnected. The driver 40 of each tester channel 26 can supply its own TEST signal edge as a timing reference when the channel's compare calibration delay is being adjusted. However since this method doesn't account for the path delay of probe 24, it should only be used with the probe's path delay is small enough to be neglected.

While the forgoing specification has described preferred embodiments of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. A method for calibrating TEST signal timing of an integrated circuit (IC) tester having a plurality of probes with tips for contacting input/output (I/O) terminals on a surface of an IC, and having a plurality of tester channels, each tester channel for generating a TEST signal at a tip of a corresponding one of said probes in response to a periodic CLOCK signal with a delay adjustable by drive calibration data supplied as input to the tester channel, the TEST signal including edges occurring in an edge timing pattern selected by programming data provided as input to the tester channel, the method comprising the steps of, for each said tester channel:

a. providing the input programming data to the tester channel so that the tester channel responds to the CLOCK signal by generating a TEST signal having a repetitive edge timing pattern at the tester channel's corresponding probe tip,
   b. supplying the input drive calibration data to the tester channel to adjust said delay with which the tester channel produces said TEST signal in response to the CLOCK signal,
   c. generating a periodic reference (REF) signal having said repetitive edge timing pattern, and
   d. cross-correlating the TEST signal generated at step b to said REF signal over a finite time interval to produce cross-correlation data indicating how closely the TEST signal matches the REF signal in phase.

2. The method in accordance with claim 1 further comprising the steps of for each said tester channel:

e. performing a plurality of iterations of steps b–d, providing the tester channel with differing values of the input drive calibration data during each iteration of step b; and
   f. determining a particular iteration of steps b–d for which cross-correlation data produced at step d indicates the channel's TEST signal most closely matched the REF signal in phase.

3. The method in accordance with claim 2 further comprising for each said tester channel the step of:

g. calibrating timing of the tester channel by providing input drive calibration data to said tester channel of value matching that of input drive calibration data provided to said tester channel during said particular iteration of steps b–d determined at step f.

4. The method in accordance with claim 3 wherein step d comprises the substeps of:

d1. generating a MATCH signal having a magnitude indicating how well an amplitude of the periodic TEST signal appearing at the probe tip matches an amplitude of the REF signal,
   d2. integrating the MATCH signal over a finite time interval to produce an analog cross-correlation (CC) signal, and
   d3. digitizing the CC signal at an end of the finite time interval to produce the cross-correlation data.

5. The method in accordance with claim 4 wherein said successive edges of said TEST signal within said repetitive edge timing pattern are separated by non-uniform intervals.

6. The method in accordance with claim 4 wherein successive edges of the TEST signal within said repetitive edge timing pattern are separated by intervals of pseudo-random duration.

7. The method in accordance with claim 3 wherein said successive edges of said TEST signal within said repetitive edge timing pattern are separated by non-uniform intervals.

8. The method in accordance with claim 3 wherein successive edges of the TEST signal edges within said repetitive edge timing pattern are separated by intervals of pseudo-random duration.

9. The method in accordance with claim 2 wherein step d comprises the substeps of:

d1. generating a MATCH signal having a magnitude indicating how well an amplitude of the periodic TEST signal appearing at the probe tip matches an amplitude of the REF signal,
   d2. integrating the MATCH signal over a finite time interval to produce an analog cross-correlation (CC) signal, and d3. digitizing the CC signal at an end of the finite time interval to produce the cross-correlation data.

10. The method in accordance with claim 1 wherein step d comprises the substeps of:

d1. generating a MATCH signal having a magnitude indicating how closely the TEST signal and the REF signal match in amplitude, and d2. generating the cross-correlation data representing an integral of the MATCH signal over a finite time interval.

11. The method in accordance with claim 10 wherein substep d2 comprises the further substeps of:

integrating the MATCH signal over said finite time interval to produce an analog cross-correlation (CC) signal, and digitizing the CC signal at an end of the finite time interval to produce the cross-correlation data.

12. The method in accordance with claim 1 wherein said successive edges of said TEST signal within said repetitive edge timing pattern are separated by non-uniform intervals.

13. The method in accordance with claim 1 wherein successive edges of the TEST signal edges within said repetitive edge timing pattern are separated by intervals of pseudo-random duration.

14. A method for calibrating TEST signal timing of an integrated circuit (IC) tester having a plurality of probes with tips for contacting input/output (I/O) terminals on a surface of an IC, and having a plurality of tester channels, each tester channel for generating a TEST signal at a tip of a corresponding one of said probes in response to a periodic CLOCK signal with a delay adjustable by drive calibration data supplied as input to the tester channel, the TEST signal including edges occurring in an edge timing pattern selected by programming data provided as input to the tester channel, the method comprising the steps of, for each said tester channel:

a. providing the input programming data to the tester channel so that the tester channel responds to the CLOCK signal by generating a TEST signal having a repetitive edge timing pattern at the tester channel's corresponding probe tip;

b. supplying the input drive calibration data to the tester channel to adjust said delay with which the tester channel produces said TEST signal in response to the CLOCK signal;

c. generating a periodic reference (REF) signal having said repetitive edge timing pattern;

d. generating a MATCH signal having a magnitude indicating how well an amplitude of the periodic TEST signal appearing at the probe tip matches an amplitude of the REF signal;

e. integrating the MATCH signal over a finite time interval to produce an analog cross-correlation (CC) signal;

f. digitizing the CC signal at an end of the finite time interval to produce the cross-correlation data;

g. performing a plurality of iterations of steps b–f, providing the tester channel with differing values of the input drive calibration data during each iteration of step b;

h. determining a particular iteration of steps b–f for which cross-correlation data produced at step f indicates the channel's TEST signal most closely matched the REF signal in phase; and i. calibrating timing of the tester channel by providing input drive calibration data to said tester channel of value matching a that of input drive calibration data provided to said tester channel during said particular iteration of steps b–f determined at step h.

15. The method in accordance with claim 14 wherein said successive edges of said TEST signal within said repetitive edge timing pattern are separated by non-uniform intervals.

16. The method in accordance with claim 14 wherein successive edges of the TEST signal edges within said repetitive edge timing pattern are separated by intervals of pseudo-random duration.

17. The method in accordance with claim 14 wherein successive edges of the TEST signal edges within said repetitive edge timing pattern are separated by intervals of uniform duration.

18. An apparatus for testing an integrated circuit (IC) having a plurality of input/output (I/O) terminals, the apparatus comprising:

means for generating a periodic CLOCK signal;

a plurality of probes with tips, each for contacting a separate I/O terminal of said IC a plurality of tester channels, each tester channel for generating a TEST signal at a tip of a corresponding one of said probes in response to a periodic CLOCK signal with a delay adjustable by drive calibration data supplied as input to the tester channel, the TEST signal including edges occurring in an edge timing pattern selected by programming data provided as input to the tester channel;

means for generating a reference (REF) signal having a repetitive edge timing pattern; and cross-correlation means for cross-correlating the TEST signal generated at each probe tip to said REF signal over a finite time interval to produce cross-correlation data indicating how closely the TEST signal matches the REF signal in phase.

19. The apparatus in accordance with claim 18 further comprising:

control means for supplying programming data supplied to each of said tester channel causing each tester channel to produce its TEST signal at its corresponding probe tip with an edge timing pattern similar to that of the REF signal, and for iteratively altering the drive calibration data input to each channel and monitoring the cross-correlation data produced by said cross-correlation means to determine for each tester channel a value of said drive calibration data for which said cross-correlation data indicates the TEST signal most closely matches the REF signal in phase.

20. The apparatus in accordance with claim 19 wherein said cross-correlation means comprises:

means for generating a MATCH signal having a magnitude indicating how well an amplitude of each of the TEST signals appearing at said probe tips matches an amplitude of the REF signal;

means for integrating the MATCH signal over a finite time interval to produce an analog cross-correlation (CC) signal, and means for digitizing the CC signal at an end of the finite time interval to produce the cross-correlation data.

21. The apparatus in accordance with claim 20 wherein the means for generating the MATCH signal comprises an exclusive OR gate.

22. The apparatus in accordance with claim 20 wherein the means for generating the MATCH signal comprises an analog multiplier circuit.

* * * * *